(12) United States Patent
Liao et al.

(10) Patent No.: US 11,171,003 B2
(45) Date of Patent: Nov. 9, 2021

(54) DOPING THROUGH DIFFUSION AND EPITAXY PROFILE SHAPING

(71) Applicant: Taiwan Semiconductor Manufacturing Company, Ltd., Hsinchu (TW)

(72) Inventors: Chih-Teng Liao, Hsinchu (TW); Yi-Wei Chiu, Kaohsiung (TW); Chih Hsuan Cheng, Houlong Township (TW); Li-Te Hsu, Shanhua Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/204,023

(22) Filed: Nov. 29, 2018

(65) Prior Publication Data

US 2019/0096674 A1   Mar. 28, 2019

Related U.S. Application Data

(62) Division of application No. 15/340,636, filed on Nov. 1, 2016.

(Continued)

(51) Int. Cl.
*H01L 21/8238* (2006.01)
*H01L 21/225* (2006.01)
(Continued)

(52) U.S. Cl.
CPC .... *H01L 21/2255* (2013.01); *H01L 21/76224* (2013.01); *H01L 21/823431* (2013.01);
(Continued)

(58) Field of Classification Search
CPC ......... H01L 21/2255; H01L 21/823892; H01L 21/823814; H01L 29/785; H01L 21/823481; H01L 21/823878
See application file for complete search history.

(56) References Cited

U.S. PATENT DOCUMENTS

| 4,666,557 A * | 5/1987 | Collins ............... H01L 21/2255 |
| | | 204/192.37 |
| 5,627,395 A | 5/1997 | Witek et al. |
| | (Continued) | |

FOREIGN PATENT DOCUMENTS

| CN | 103681347 A | 3/2014 |
| CN | 105431929 A | 3/2016 |
| | (Continued) | |

*Primary Examiner* — Mohammad M Choudhry
(74) *Attorney, Agent, or Firm* — Slater Matsil, LLP

(57) ABSTRACT

A method includes etching a semiconductor substrate to form a first trench and a second trench. A remaining portion of the semiconductor substrate is left between the first trench and the second trench as a semiconductor region. A doped dielectric layer is formed on sidewalls of the semiconductor region and over a top surface of the semiconductor region. The doped dielectric layer includes a dopant. The first trench and the second trench are filled with a dielectric material. An anneal is then performed, and a p-type dopant or an n-type dopant in the doped dielectric layer is diffused into the semiconductor region to form a diffused semiconductor region.

20 Claims, 20 Drawing Sheets

Related U.S. Application Data

(60) Provisional application No. 62/368,545, filed on Jul. 29, 2016.

(51) Int. Cl.
*H01L 21/8234* (2006.01)
*H01L 21/762* (2006.01)
*H01L 29/08* (2006.01)
*H01L 29/66* (2006.01)
*H01L 29/78* (2006.01)

(52) U.S. Cl.
CPC .......... *H01L 21/823814* (2013.01); *H01L 21/823892* (2013.01); *H01L 29/0847* (2013.01); *H01L 29/66803* (2013.01); *H01L 29/785* (2013.01); *H01L 21/823481* (2013.01); *H01L 21/823878* (2013.01)

(56) References Cited

U.S. PATENT DOCUMENTS

| | | | |
|---|---|---|---|
| 5,851,900 A * | 12/1998 | Chu | H01L 21/76224 438/434 |
| 5,883,436 A * | 3/1999 | Sadjadi | H01L 21/76804 257/758 |
| 6,410,410 B1 | 6/2002 | Feudel et al. | |
| 7,678,630 B2 | 3/2010 | Lindsay | |
| 8,637,359 B2 | 1/2014 | Chang et al. | |
| 8,652,932 B2 | 2/2014 | Adam et al. | |
| 9,385,218 B1 | 7/2016 | Cheng et al. | |
| 9,530,700 B1 | 12/2016 | Mallela et al. | |
| 9,716,146 B2 | 7/2017 | Peng et al. | |
| 2002/0047175 A1* | 4/2002 | Tani | H01L 27/14609 257/432 |
| 2007/0026629 A1 | 2/2007 | Chen et al. | |
| 2007/0222020 A1* | 9/2007 | Cheng | H01L 27/1087 257/499 |
| 2008/0042212 A1 | 2/2008 | Kamath et al. | |
| 2013/0161756 A1 | 6/2013 | Glass et al. | |
| 2013/0175584 A1* | 7/2013 | Ho | H01L 29/66795 257/288 |
| 2013/0175659 A1 | 7/2013 | Liu | |
| 2014/0065782 A1 | 3/2014 | Lu et al. | |
| 2015/0147861 A1 | 5/2015 | Park et al. | |
| 2015/0179503 A1* | 6/2015 | Tsai | H01L 21/76224 257/347 |
| 2015/0243745 A1 | 8/2015 | Kelley et al. | |
| 2016/0056156 A1 | 2/2016 | Ghani et al. | |
| 2016/0099150 A1 | 4/2016 | Tsai et al. | |
| 2016/0149011 A1* | 5/2016 | Hu | H01L 21/26513 257/741 |
| 2016/0315146 A1 | 10/2016 | Jung et al. | |
| 2017/0170278 A1 | 6/2017 | Peng et al. | |

FOREIGN PATENT DOCUMENTS

| | | |
|---|---|---|
| DE | 102007004789 A1 | 8/2007 |
| DE | 10058031 B4 | 11/2007 |
| DE | 112013000813 T5 | 12/2014 |
| DE | 102012207913 B4 | 5/2015 |
| KR | 1020140029094 A | 3/2014 |
| KR | 1020160022810 A | 3/2016 |

* cited by examiner

DOPING THROUGH DIFFUSION AND EPITAXY PROFILE SHAPING

PRIORITY CLAIM AND CROSS-REFERENCE

This application is a divisional of U.S. patent application Ser. No. 15/340,636, entitled "Doping Through Diffusion and Epitaxy Profile Shaping," and filed on Nov. 1, 2016, which claims the benefit of the following provisionally filed U.S. Patent application: Application Ser. No. 62/368,545, filed Jul. 29, 2016, and entitled "Doping Through Diffusion and Epitaxy Shaping;" which applications are hereby incorporated herein by reference.

BACKGROUND

Technological advances in Integrated Circuit (IC) materials and design have produced generations of ICs, with each generation having smaller and more complex circuits than the previous generations. In the course of IC evolution, functional density (for example, the number of interconnected devices per chip area) has generally increased while geometry sizes have decreased. This scaling down process provides benefits by increasing production efficiency and lowering associated costs.

Such scaling down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

The formation of FinFETs typically involves forming semiconductor fins, implanting the semiconductor fins to form well regions, forming dummy gate electrodes on the semiconductor fins, etching end portions of the semiconductor fins, and performing an epitaxy to regrow source/drain regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 14A are cross-sectional views and perspective views of intermediate stages in the formation of Fin Field-Effect Transistors (FinFETs) in accordance with some embodiments.

DETAILED DESCRIPTION

Figure 1:
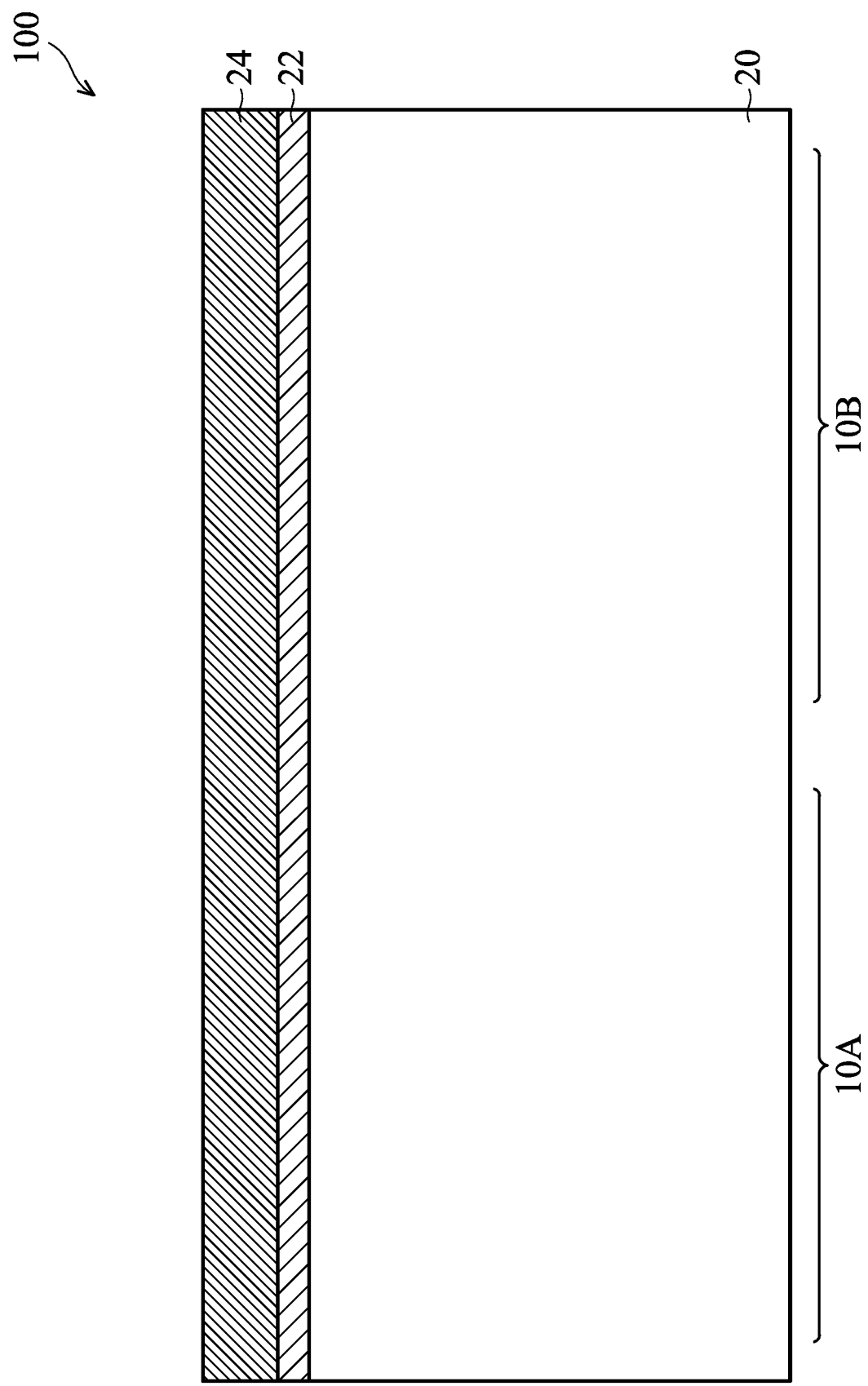

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and the methods of forming the same are provided in accordance with various exemplary embodiments. The intermediate stages of forming the FinFETs are illustrated. The variations of some embodiments are discussed. Throughout various views and illustrative embodiments, like reference numbers are used to designate like elements.

Figure 18:
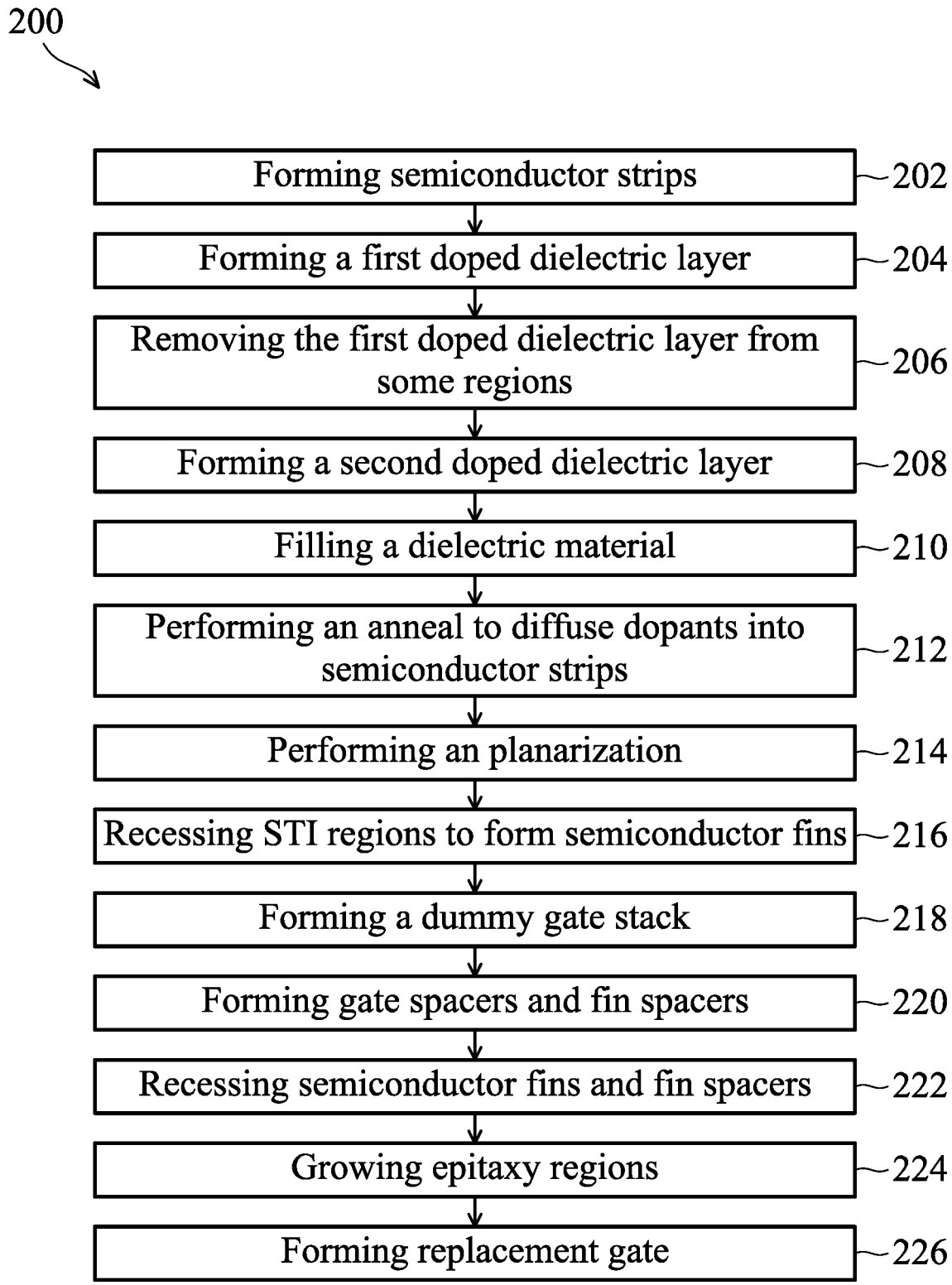
FIG. 18 illustrates a process flow for forming FinFETs in accordance with some embodiments.

FIGS. 1 through 14A illustrate the cross-sectional views and perspective views of intermediate stages in the formation of a FinFET in accordance with some embodiments. The steps shown in FIGS. 1 through 14A are also illustrated schematically in the process flow 200 shown in FIG. 18.

FIG. 1 illustrates a cross-sectional view of substrate 20, which is a part of wafer 100. Substrate 20 may be a bulk substrate or a semiconductor-on-insulator substrate. In accordance with some embodiments of the present disclosure, substrate 20 is formed of a semiconductor material selected from, and not limited to, silicon germanium, silicon carbon, germanium, and III-V compound semiconductor materials such as GaAsP, AlInAs, AlGaAs, GaInAs, GaInP, GaInAsP, and the like. Substrate 20 may be lightly doped with a p-type or an n-type impurity. Wafer 100 includes N-type Metal Oxide Semiconductor (NMOS) region 10A and P-type Metal Oxide Semiconductor (PMOS) region 10B, in which a NMOS transistor and a PMOS transistor, respectively, are to be formed.

Pad oxide 22 and hard mask 24 are formed over semiconductor substrate 20. In accordance with some embodiments of the present disclosure, pad oxide 22 is formed of silicon oxide, which may be formed by oxidizing a surface layer of semiconductor substrate 20. Hard mask 24 may be formed of silicon nitride, silicon oxynitride, silicon carbide, silicon carbo-nitride, or the like. In accordance with some embodiments of the present disclosure, mask layer 24 is formed of silicon nitride, for example, using Low-Pressure Chemical Vapor Deposition (LPCVD). In accordance with other embodiments of the present disclosure, mask layer 24 is formed by thermal nitridation of silicon, Plasma Enhanced Chemical Vapor Deposition (PECVD), or plasma anodic nitridation.

Figure 2:
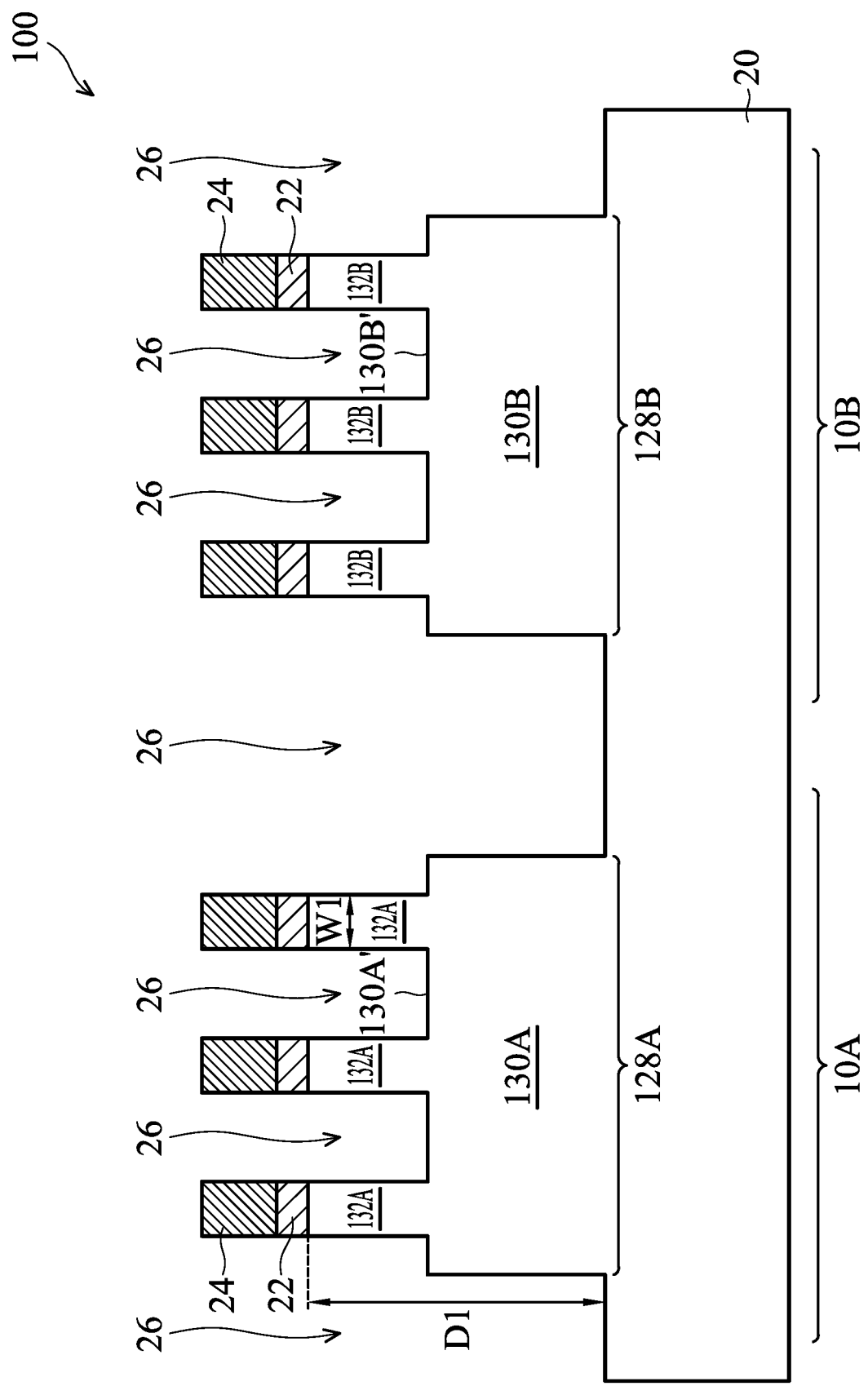

Next, as shown in FIG. 2, hard mask 24, pad oxide 22, and substrate 20 are patterned to form trenches 26, during which hard mask 24 is patterned first, and is then used as an etching mask to pattern the underlying pad oxide 22 and substrate 20. Accordingly, semiconductor strips 128A and 128B are formed in NMOS region 10A and PMOS region 10B, respectively. The respective step is illustrated as step 202 in the process flow shown in FIG. 18. Trenches 26 extend into semiconductor substrate 20, and separate semiconductor strips 128A and 128B from each other. In the top view of wafer 100, each or some of semiconductor strips 128A and 128B may be encircled by respective trenches 26. In accordance with some embodiments of the present disclosure, depth D1 of trenches 26 is in the range between about 100 nm and about 150 nm. It is appreciated that the values recited throughout the description are examples, and different values may also be adopted without changing the principle of the present disclosure.

In accordance with some embodiments of the present disclosure, semiconductor strips 128A and 128B are referred to as crown-shape semiconductor strips. Semiconductor strip 128A includes semiconductor base 130A and semiconductor strips 132A over base 130A. Semiconductor strip 128B includes semiconductor base 130B and semiconductor strips 132B over base 130B. Although FIG. 2 illustrates that there are three semiconductor strips 132A (or 132B) over base 130A (or 130B), the number of semiconductor strips 132A and 132B on each of the respective bases 130A and 130B may be any integer number such as 1, 2, 3, 4, 5, or more, depending on the desirable drive currents of the resulting FinFETs. The top surface 130A' of base 130A and top surface 130B' of base 130B may be substantially planar, or may be curved with dishing. Fin width W1 of semiconductor strips 132A and/or 132B may be in the range between about 10 nm and about 20 nm, for example.

In accordance with some embodiments of the present disclosure, the formation of semiconductor strips 128A and 128B includes etching semiconductor substrate 20 to form strips 132A and 132B, forming sacrificial spacer layers (not shown) to cover the sidewalls of semiconductor strips 132A and 132B, and using the sacrificial spacer layers and hard masks 24 in combination as an etching mask to further etch semiconductor substrate 20. The neighboring semiconductor strips 132A are close to each other, and hence the portions of semiconductor substrate 20 between neighboring semiconductor fins 132A/132B are not etched down. As a result, bases 130A and 130B are formed. The sacrificial spacer layers are then removed.

Figure 3:
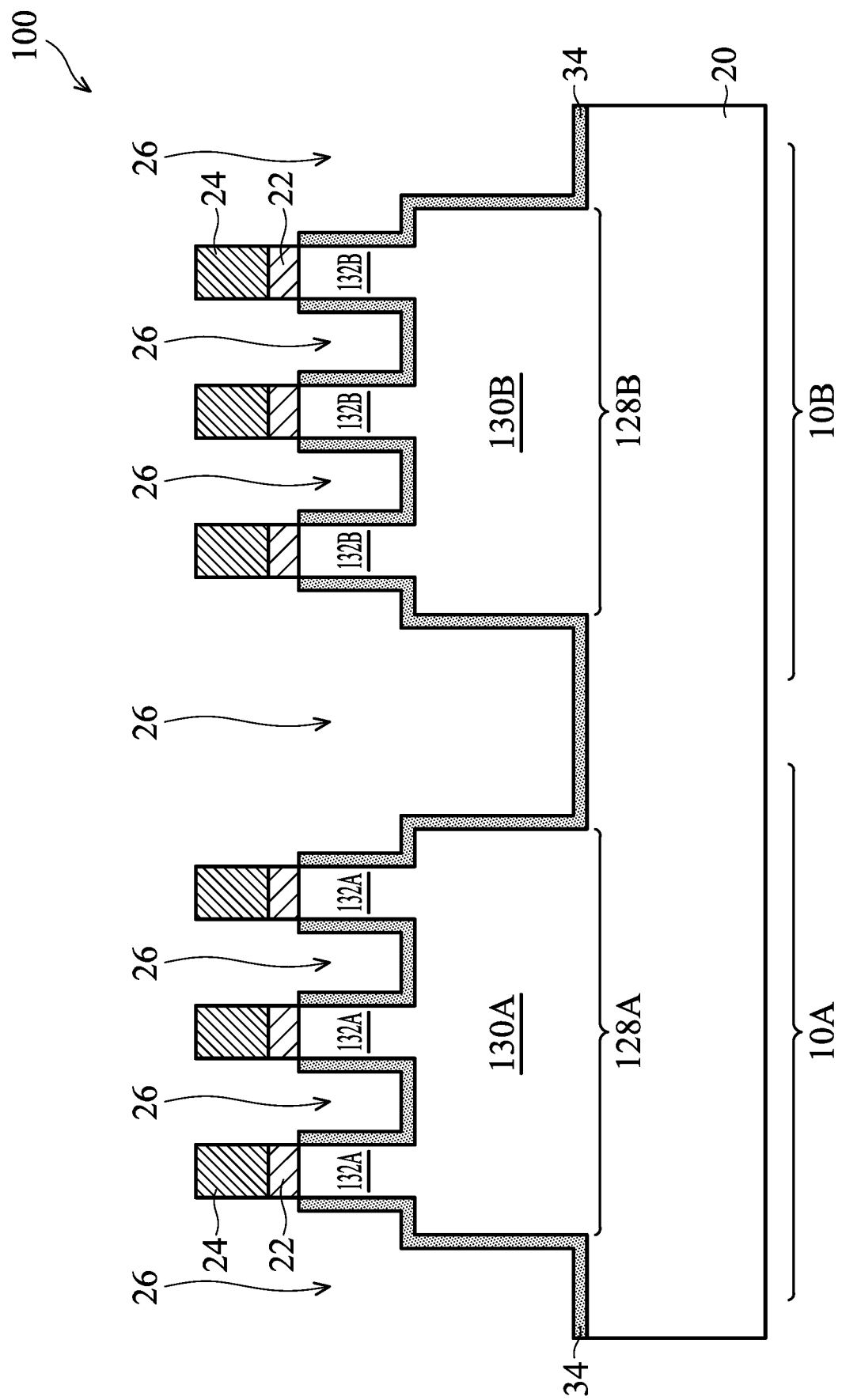
Figure 4:
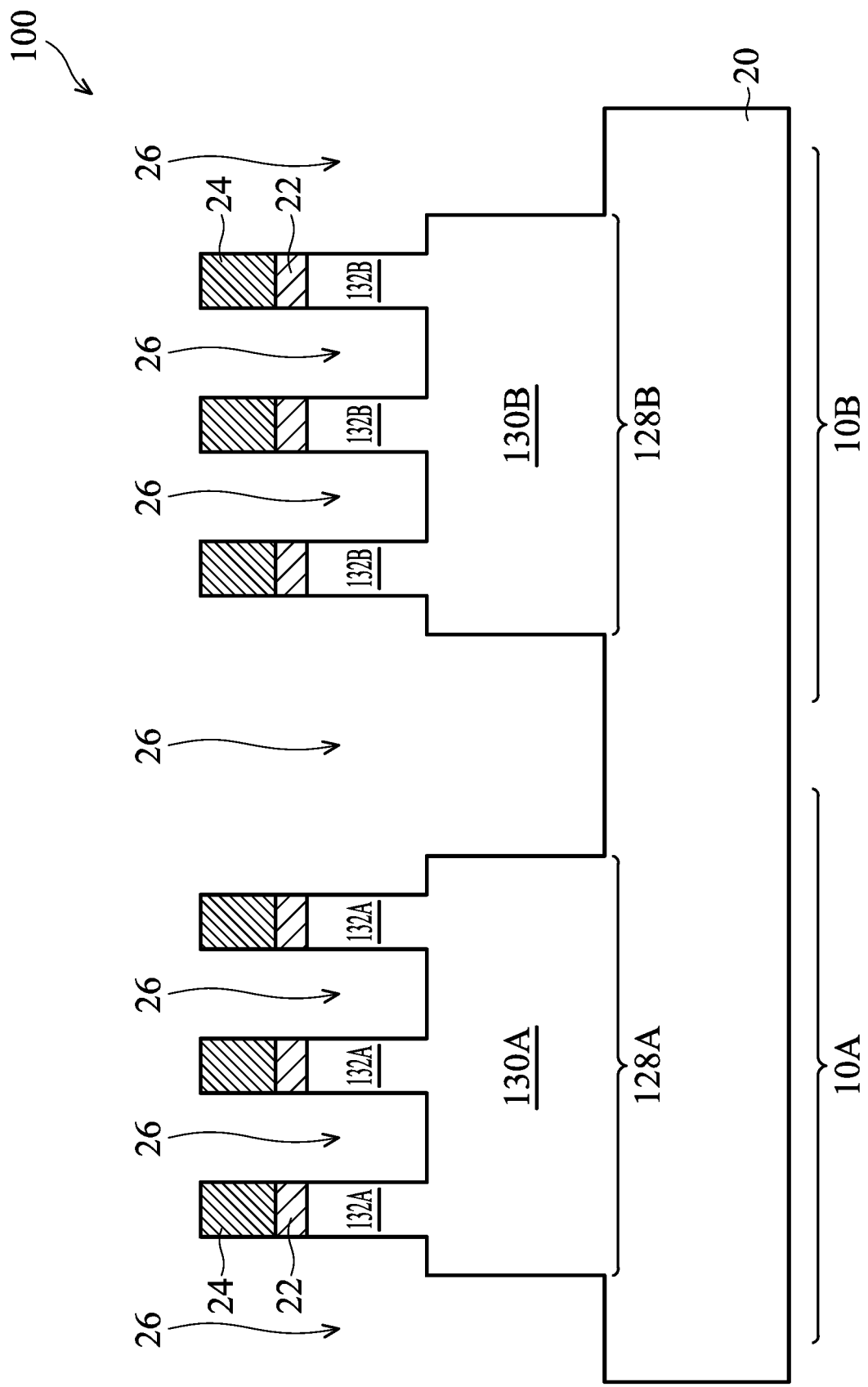

FIGS. 3 and 4 illustrate the formation and the removal of sacrificial liner oxide layer 34, which is formed on the exposed surfaces of crown-shape semiconductor strips 128A and 128B. Referring to FIG. 3, sacrificial liner oxide layer 34 is formed as a conformal layer, whose horizontal portions and vertical portions have thicknesses close to each other. In accordance with some embodiments of the present disclosure, sacrificial liner oxide layer 34 is formed by oxidizing wafer 100 in an oxygen-containing environment, for example, through Local Oxidation of Silicon (LOCOS), wherein oxygen ($O_2$) may be included in the respective process gas. In accordance with other embodiments of the present disclosure, sacrificial liner oxide layer 34 is formed using In-Situ Steam Generation (ISSG), for example, with water steam or a combined gas of hydrogen ($H_2$) and oxygen ($O_2$) used to oxidize the exposed semiconductor substrate 20 and crown-shape semiconductor strips 128A and 128B. The ISSG oxidation may be performed at an elevated temperature higher than room temperature.

Sacrificial liner oxide layer 34 is then removed, for example, in a wet etching or dry etching process, wherein HF solution or a combined gas of $NH_3$ (ammonia) and $HF_3$ may be used. The resulting structure is shown in FIG. 4. As a result, the surfaces of crown-shape semiconductor strips 128A and 128B are revealed again. The formation and the removal of sacrificial liner oxide layer 34 may cause advantageous re-profile of the surfaces of crown-shape semiconductor strips 128A and 128B. For example, some undesired protrusions may be removed due to the higher oxidation rate of protrusions than smooth portions. The performance of the resulting FinFETs may thus benefit from the formation and the removal of sacrificial liner oxide layer 34.

Figure 5:
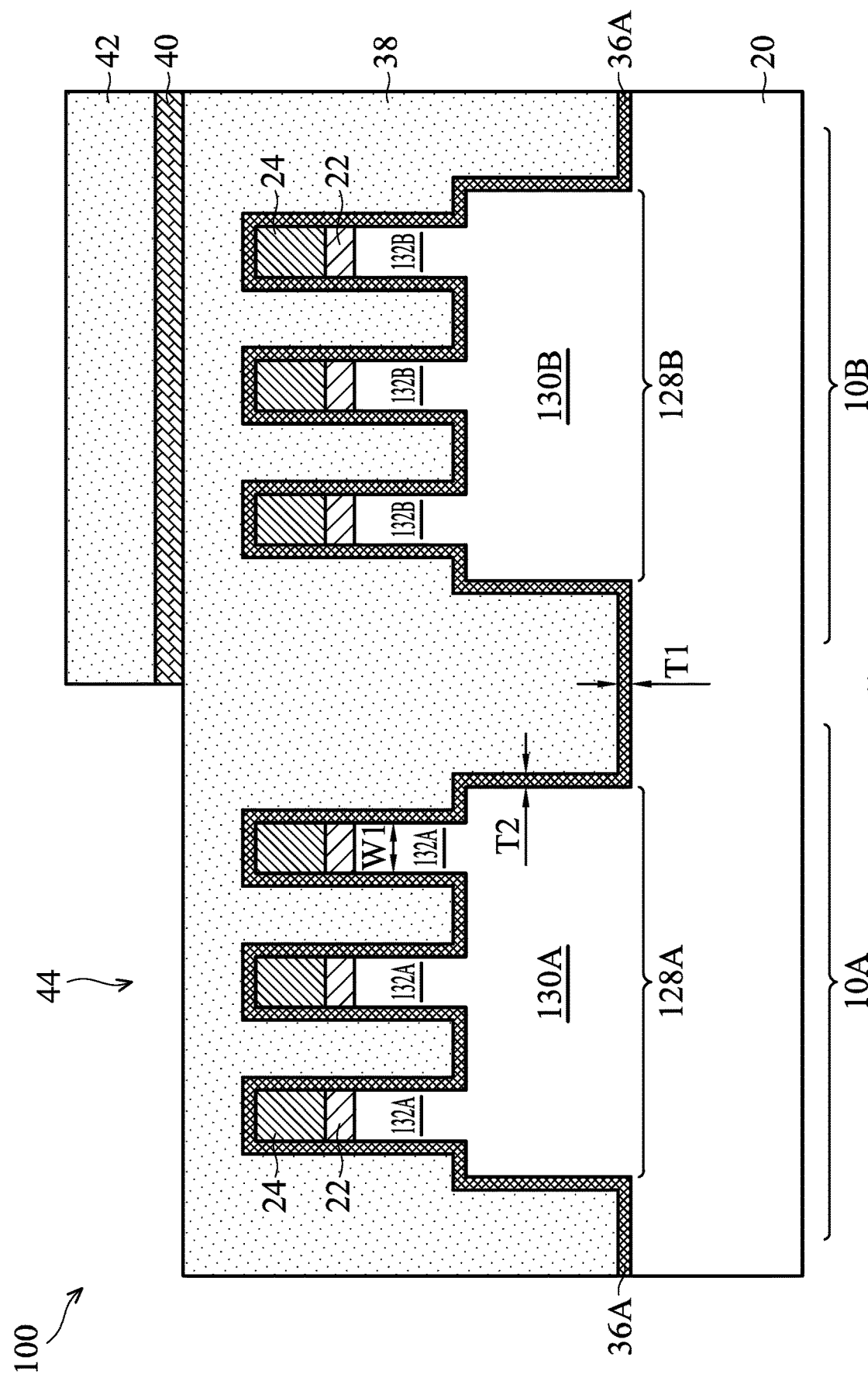

FIG. 5 illustrates the deposition of n-type doped dielectric layer 36A, which is deposited as a blanket layer. The respective step is illustrated as step 204 in the process flow shown in FIG. 18. In accordance with some embodiments, n-type doped dielectric layer 36A comprises phosphorous, and may be a Phospho-Silicate-Glass (PSG) layer. N-type doped dielectric layer 36A may also be formed of an oxide such as silicon oxide, a nitride such as silicon nitride, or other dielectric materials. N-type doped dielectric layer 36A may be doped with phosphorous, arsenic, and/or antimony. N-type doped dielectric layer 36A may be deposited using a conformal deposition method such as Atomic Layer Deposition (ALD), Chemical Vapor Deposition (CVD), or the like. As a result, thickness T1 of the horizontal portions and thickness T2 of the vertical portions of n-type doped dielectric layer 36A are close to each other, for example, with a difference smaller than about 20 percent (or 10 percent) of thickness T1. In accordance with some embodiments of the present disclosure, n-type doped dielectric layer 36A is a phosphorus-rich layer, wherein the atomic percentage of phosphorous in n-type doped dielectric layer 36A is higher than about 20 percent or higher. Thicknesses T1 and T2 of n-type doped dielectric layer 36A may be in the range between about 8 Å and about 12 Å. Furthermore, ratio T2/W1 may be in the range between about 10% and about 18%.

Further referring to FIG. 5, a patterned lithography mask is formed to cover PMOS region 10B, while leaving NMOS region 10A opened. In accordance with some embodiments of the present disclosure, the patterned lithography mask includes a tri-layer, which includes bottom layer (also known as an under layer) 38, middle layer 40 over bottom layer 38, and upper layer 42 over middle layer 40. In accordance with some embodiments of the present disclosure, bottom layer 38 and upper layer 42 are formed of photo resists. Middle layer 40 may be formed of an inorganic material, which may be a carbide (such as silicon oxycarbide), a nitride (such as silicon nitride), an oxynitride (such as silicon oxynitride), an oxide (such as silicon oxide), or the like. Upper layer 42 is patterned to form opening 44, through which n-type doped dielectric layer 36A is removed.

Figure 6:
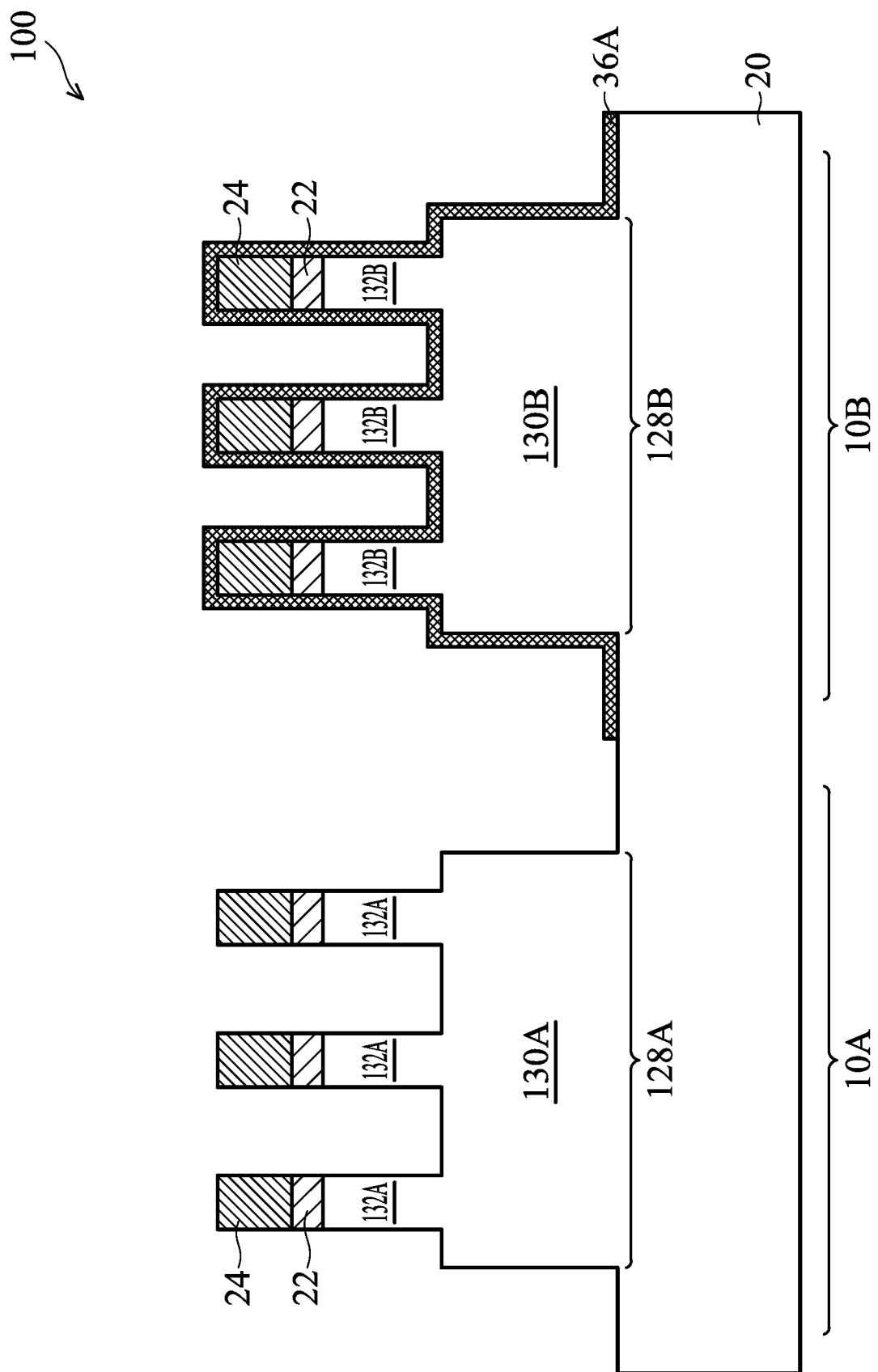

Next, an anisotropic etching is performed using the tri-layer as an etching mask. In the etching process, the portion of middle layer 40 and bottom layer 38 directly underlying opening 44 is etched using the patterned upper layer 42 as an etching mask, so that n-type doped dielectric layer 36A is exposed. After bottom layer 38 is removed from NMOS region 10A, an isotropic etch is performed to remove the exposed portions of n-type doped dielectric layer 36A from NMOS region 10A. The respective step is illustrated as step 206 in the process flow shown in FIG. 18. The etching of layer 36A may include a wet etch and/or a dry etch. In the dry etch, process gases such as HF and Ar may be used. In the wet etch, etchant such as $H_2SO_4$ may be used. The portion of n-type doped dielectric layer 36A in PMOS region 10B is protected, and is not removed. The remaining portion of bottom layer 38 is then removed, resulting in the structure as shown in FIG. 6.

Figure 7:
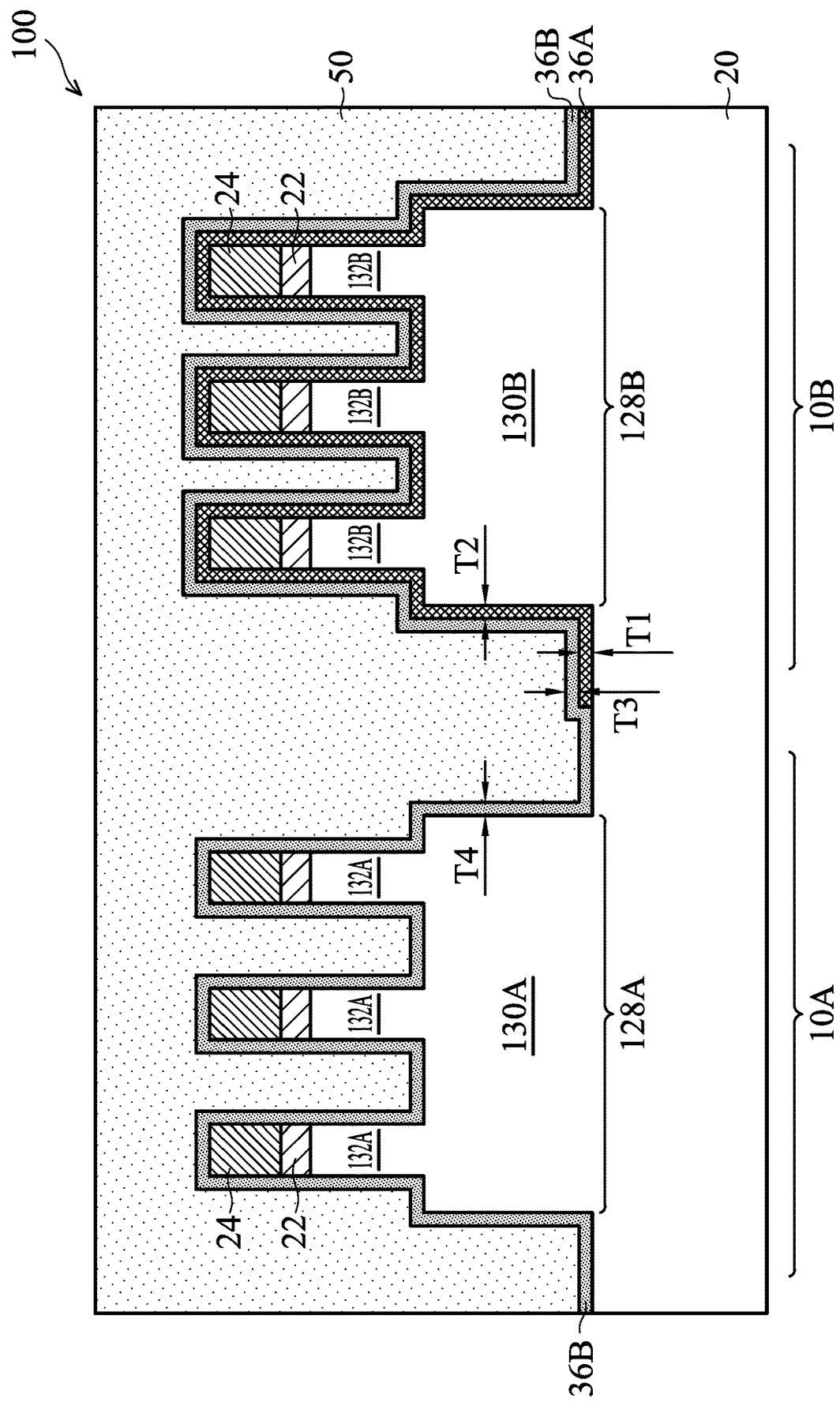

FIG. 7 illustrates the deposition of p-type doped dielectric layer 36B, which is deposited as a blanket layer. The respective step is illustrated as step 208 in the process flow shown in FIG. 18. P-type doped dielectric layer 36B includes a p-type dopant such as boron and/or indium. P-type doped dielectric layer 36B may be formed of an oxide such as silicon oxide, a nitride such as silicon nitride, or another dielectric material. In accordance with some embodiments of the present disclosure, p-type doped dielectric layer 36B is a Boro-Silicate-Glass (BSG) layer. P-type doped dielectric layer 36B may be deposited using a conformal deposition method such as ALD, CVD, or the like. As a result, thickness T3 of the horizontal portions and thickness T4 of the vertical portions of p-type doped dielectric layer 36B are close to each other, for example, with a difference smaller than about 20 percent (or 10 percent) of T3. In accordance with some embodiments of the present disclosure, p-type doped dielectric layer 36B is a boron-rich layer, wherein the atomic percentage of boron in p-type doped dielectric layer 36B is higher than about 35 percent or higher. Thicknesses T3 and T4 of p-type doped dielectric layer 36B may be in the same range as thicknesses T1 and T2 of n-type doped dielectric layer 36A. In NMOS region 10A, p-type doped dielectric layer 36B may be in physical contact with the exposed surfaces of crown-shape semiconductor strip 128A. In PMOS region 10B, p-type doped dielectric layer 36B is separated from the underlying crown-shape semiconductor strip 128B by n-type doped dielectric layer 36A.

FIG. 7 further illustrates the formation of dielectric material 50, which fills the trenches separating semiconductor strips. The respective step is illustrated as step 210 in the process flow shown in FIG. 18. Dielectric material 50 may be formed of silicon oxide, silicon carbide, silicon nitride, or multi-layers thereof. The formation method of dielectric material 50 may be selected from Flowable Chemical Vapor Deposition (FCVD), spin-on coating, Chemical Vapor Deposition (CVD), Atomic Layer Deposition (ALD), High-Density Plasma Chemical Vapor Deposition (HDPCVD), LPCVD, and the like. Dielectric material 50 may be free from n-type and p-type dopants.

In accordance with some embodiments in which FCVD is used, a silicon-containing precursor (for example, trisilylamine (TSA) or disilylamine (DSA)) is used, and the resulting dielectric material 50 is flowable (jelly-like). In accordance with alternative embodiments of the present disclosure, the flowable dielectric material 50 is formed using an alkylamino silane based precursor. During the deposition, plasma is turned on to activate the gaseous precursors for forming the flowable oxide.

After dielectric material 50 is formed, an anneal step is performed on wafer 100. The respective step is illustrated as step 212 in the process flow shown in FIG. 18. Dielectric material 50, if being flowable at this time, will be converted into a solid dielectric material. The anneal also improves the quality of dielectric material 50, for example, resulting in the increase in the density of dielectric material 50. In accordance with some embodiments of the present disclosure, the anneal is performed using a method selected from furnace anneal, chamber anneal, tube anneal or the like. For example, when furnace anneal is performed, the annealing temperature may be between about 750° C. and about 1,050° C., and the anneal duration may be in the range between about 10 minutes and about 30 minutes. The annealing may be performed in an oxygen-containing environment or in an environment not containing oxygen ($O_2$, $O_3$, or the like).

Figure 8:
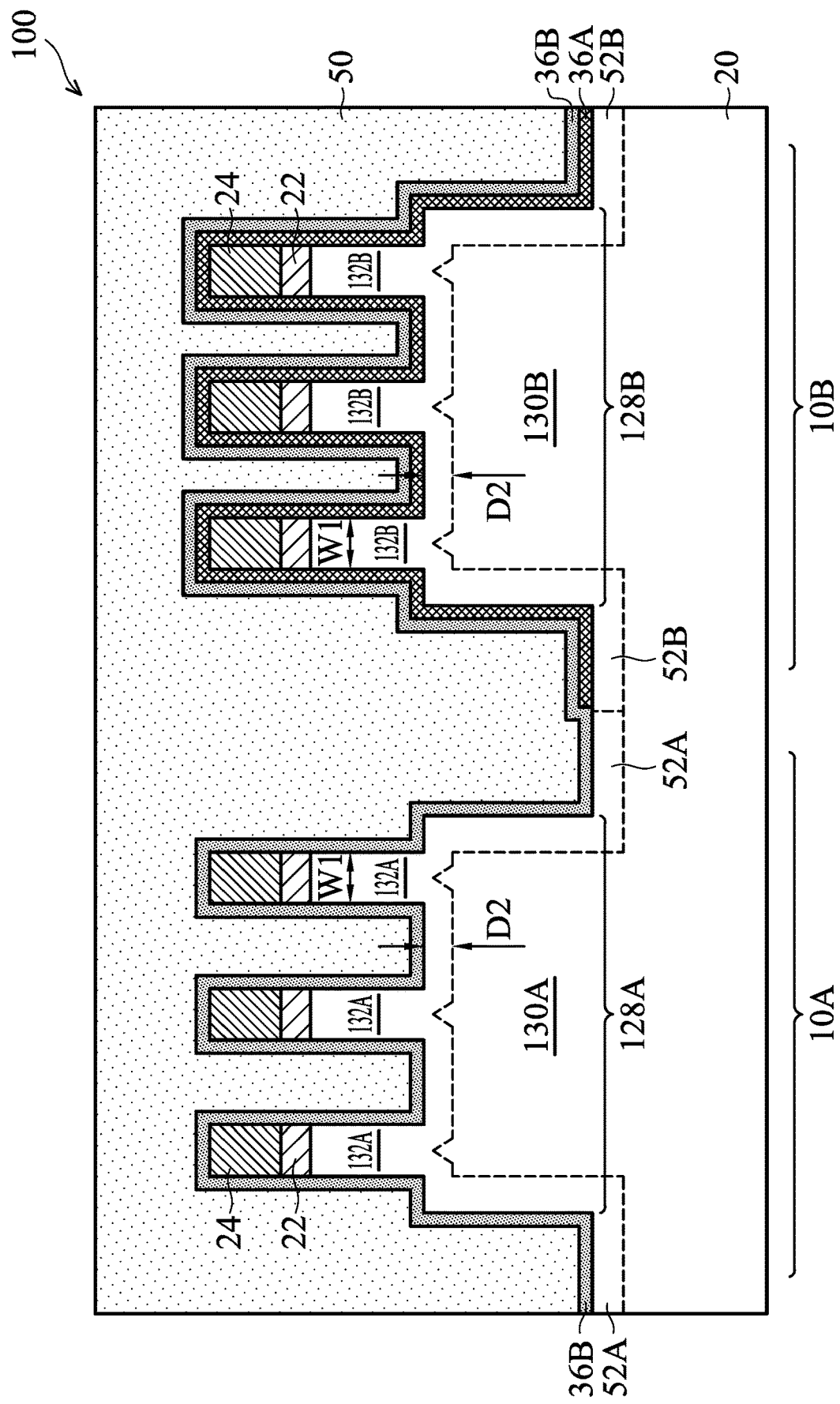

In NMOS region 10A, the anneal results in the diffusion of the p-type dopant such as boron into the surface layer of crown-shape semiconductor strip 128A. Accordingly, p-type region 52A is formed, as shown in FIG. 8. The annealing causes the p-type dopant to diffuse deeper than a half of the width W1 of semiconductor strips 132A. Accordingly, an entirety of semiconductor strips 132A and the surface layers of semiconductor base 130A are diffused to form p-type diffused region 52A. In PMOS region 10B, the anneal results in both the n-type dopant in layer 36A and p-type dopant in layer 36B to be diffused to form diffused region 52B, as also shown in FIG. 8. However, since layer 36B is over layer 36A, and is farther away from crown-shape semiconductor strip 128B, the n-type dopant concentration is higher than the p-type dopant concentration, and the diffused region 52B is an n-type region. Furthermore, the n-type dopant concentration in layer 36A may be adjusted to be higher than the p-type dopant concentration in layer 36B to ensure diffused region 52B is of n-type. Similarly, the annealing causes the n-type dopant to diffuse deeper than W1/2. Accordingly, an entirety of semiconductor strips 132B and the surface layers of semiconductor base 130B are n-type regions. In accordance with some embodiments of the present disclosure, the diffusion depth D2 is in the range between about 5 nm and about 20 nm.

In accordance with alternative embodiments of the present disclosure, rather than forming n-type doped dielectric layer 36A and removing it from region 10A, and then blanket forming p-type doped dielectric layer 36B, p-type doped dielectric layer 36B is blanket formed and removed from region 10A, followed by forming n-type doped dielectric layer 36A as a blanket layer. The resulting diffused regions 52A and 52B are also of p-type and n-type, respectively.

Figure 9:
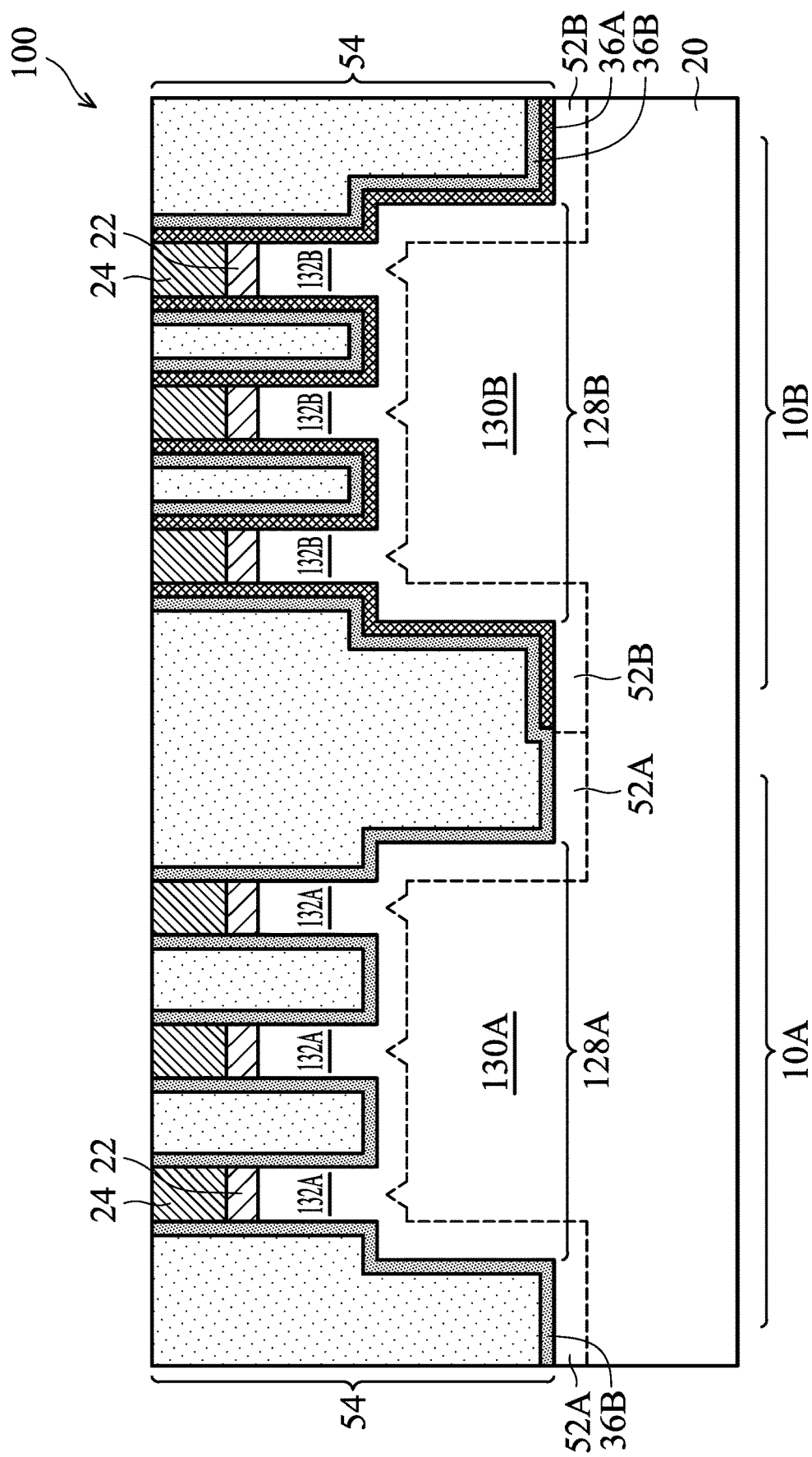

A planarization such as a Chemical Mechanical Polish (CMP) is then performed, as also shown in FIG. 9. The respective step is illustrated as step 214 in the process flow shown in FIG. 18. The remaining portions of layers 36A and 36B and dielectric material form isolation regions 54, which are also referred to as Shallow Trench Isolation (STI) regions. Mask layer 24 may be used as the CMP stop layer, and hence the top surface of mask layer 24 is substantially coplanar with the top surface of STI regions 54. Mask layer 24 is then removed, for example, using $H_3PO_4$ as an etchant.

Figure 10:
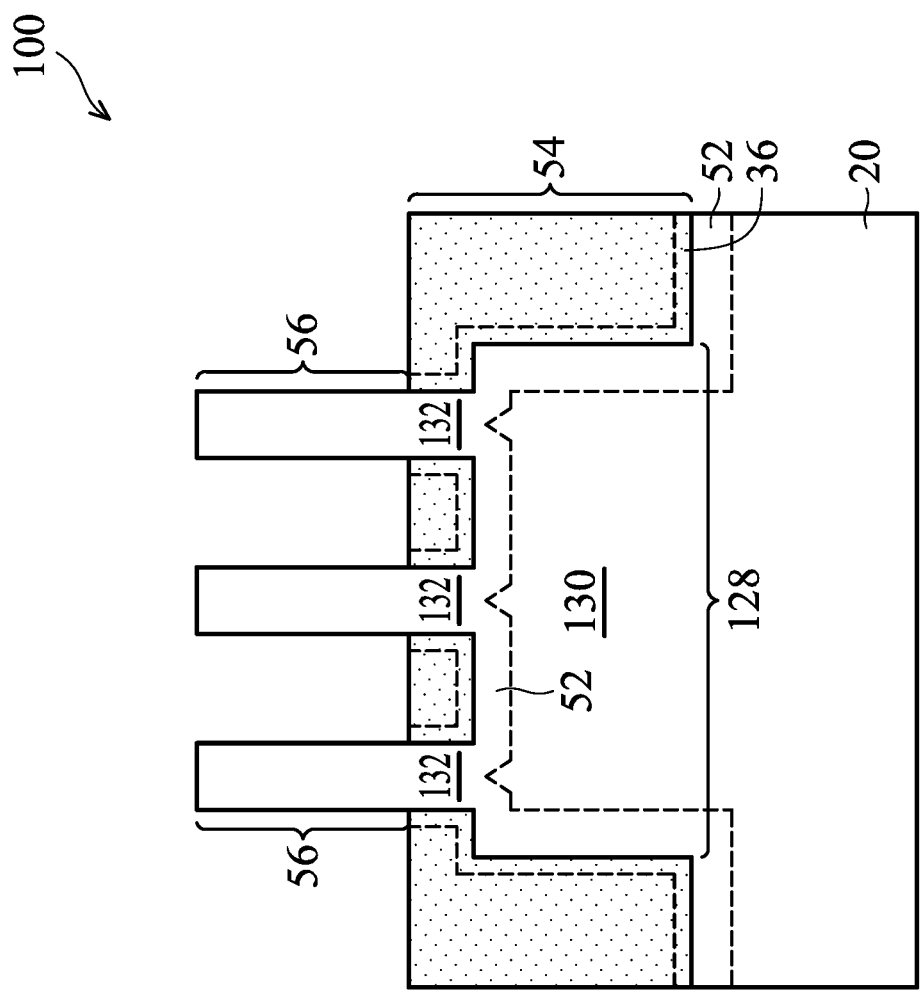

In the subsequent process steps, n-type FinFETs and p-type FinFETs are formed, for example, in NMOS region 10A and PMOS region 10B, respectively. The subsequent drawings illustrate the formation of one FinFET, which represents both n-type FinFETs and p-type FinFETs. For example, referring to FIG. 10, when the respective FinFET that is to be formed is an n-type FinFET, the structure shown in FIG. 10 represents the structure shown in NMOS region 10A (FIG. 9). Accordingly, diffused region 52 represents diffused p-type region 52A, strips 132 represent semiconductor strip 132A, and doped layer 36 represents p-type doped dielectric layer 36B. Also, crown-shape semiconductor strip 128 represents semiconductor strip 128A. When the respective FinFET that is to be formed is a p-type FinFET, the structure shown in FIG. 10 represents the structure shown in PMOS region 10B (FIG. 9). Accordingly, region 52 represents diffused n-type region 52B, strips 132 represent semiconductor strip 132B, and doped layer 36 represents n-type doped dielectric layer 36A and p-type doped dielectric layer 36B over layer 36A. Also, crown-shape semiconductor strip 128 represents semiconductor strip 128B. It is appreciated that both the n-type and p-type FinFETs are formed on the same wafer 100 and in the same chips.

Referring to FIG. 10, STI regions 54 are recessed, and pad layer 22 (FIG. 9) may also be removed in the same process. The respective step is illustrated as step 216 in the process flow shown in FIG. 18. The recessing of STI regions 54 may be performed using an isotropic etching process, which may be a dry etch process or a wet etch process. The recessing of STI regions 54 results in the top portions of semiconductor strips 132 to protrude over the top surfaces of STI regions 54. The protruding portions are referred to as semiconductor fins (or protruding fins) 56 hereinafter.

Figure 11:
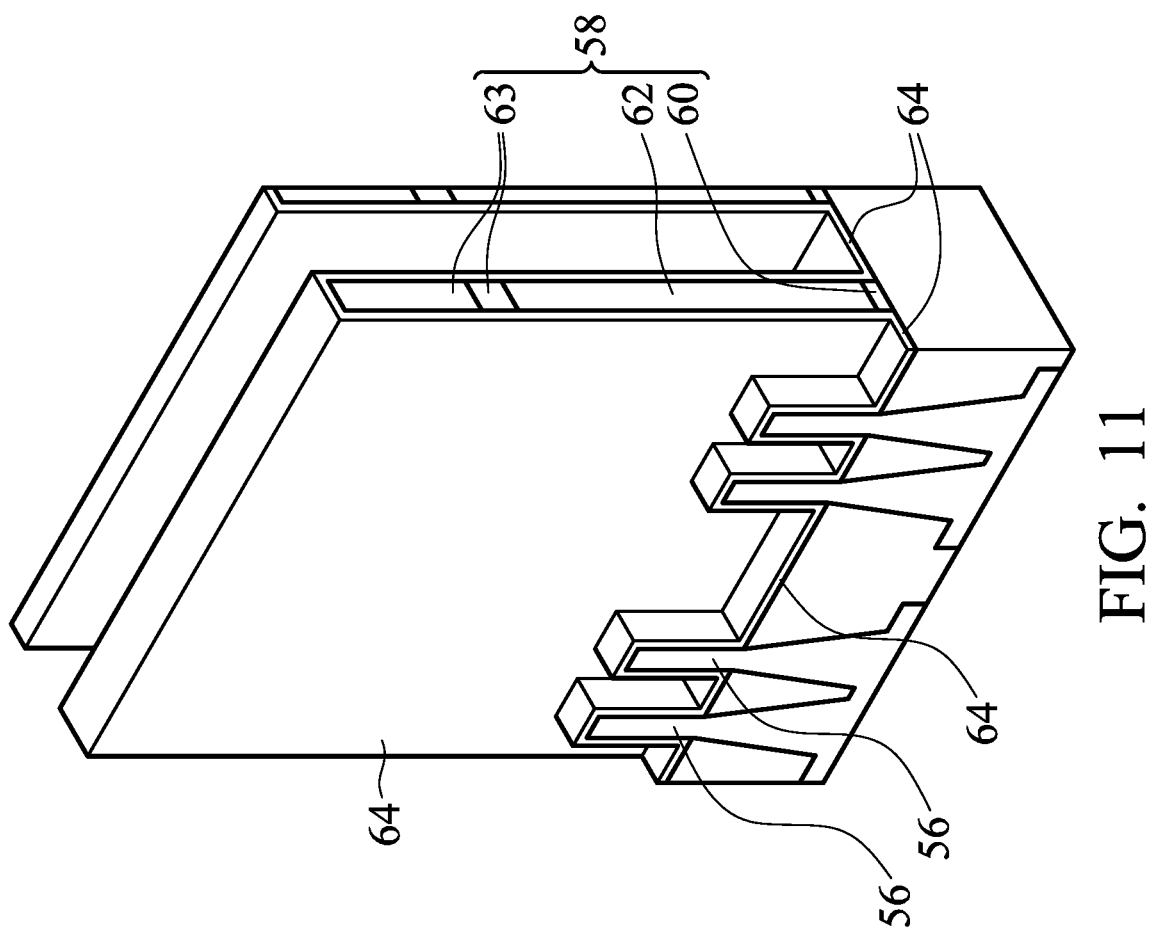

FIG. 11 illustrates the perspective view of the formation of dummy gate stack 58 in accordance with some embodiments of the present disclosure. The respective step is illustrated as step 218 in the process flow shown in FIG. 18. Dummy gate stack 58 may include dummy gate dielectric 60 and dummy gate electrode 62 over dummy gate dielectric 60. Dummy gate dielectric 60 may be formed of silicon oxide. Dummy gate electrode 62 may be formed of polysilicon in accordance with some embodiments. Hard masks 63, which may be formed of silicon nitride, for example, may be formed over dummy gate electrode 62.

Spacer layer 64 is formed as a blanket layer. In accordance with some embodiments of the present disclosure, spacer layer 64 is formed using a conformal deposition method such as ALD, CVD, etc., so that the sidewall portions of spacer layer 64 have an adequate thickness. The horizontal portions and vertical portions of spacer layer 64 may have substantially the same thickness, for example, with the vertical thickness of the vertical portions and the horizontal thickness of the horizontal portions having a difference smaller than 20 percent of the horizontal thickness.

The material of spacer layer 64 may include silicon nitride, silicon oxy-carbo-nitride (SiOCN), silicon carbonitride (SiOC), or a metal oxide such as aluminum oxide. In accordance with some embodiments of the present disclosure, spacer layer 64 is formed of SiOCN, and may have a single-layer structure. In accordance with alternative embodiments, spacer layer 64 has a composite structure including a plurality of layers. For example, spacer layer 64 may include a silicon oxide layer, and a silicon nitride layer over the silicon oxide layer.

Figure 12A:
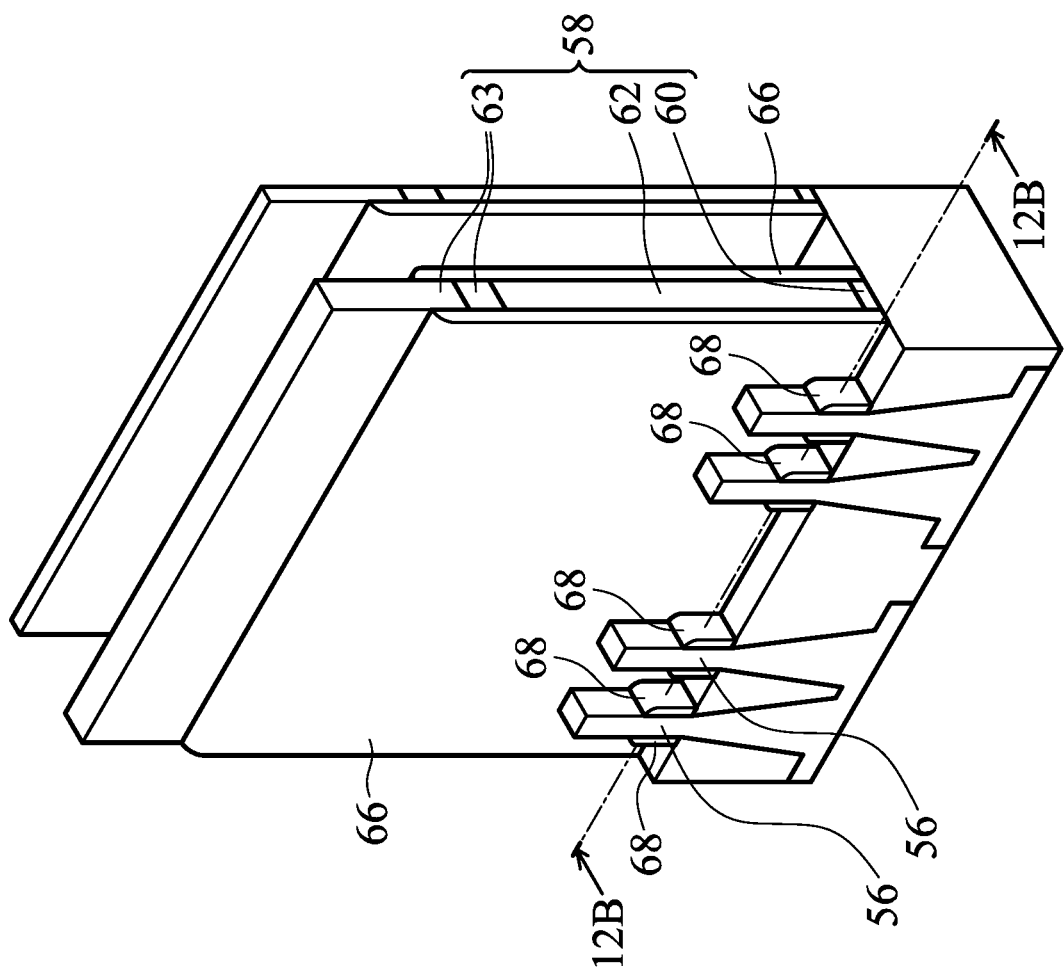
Figure 12B:
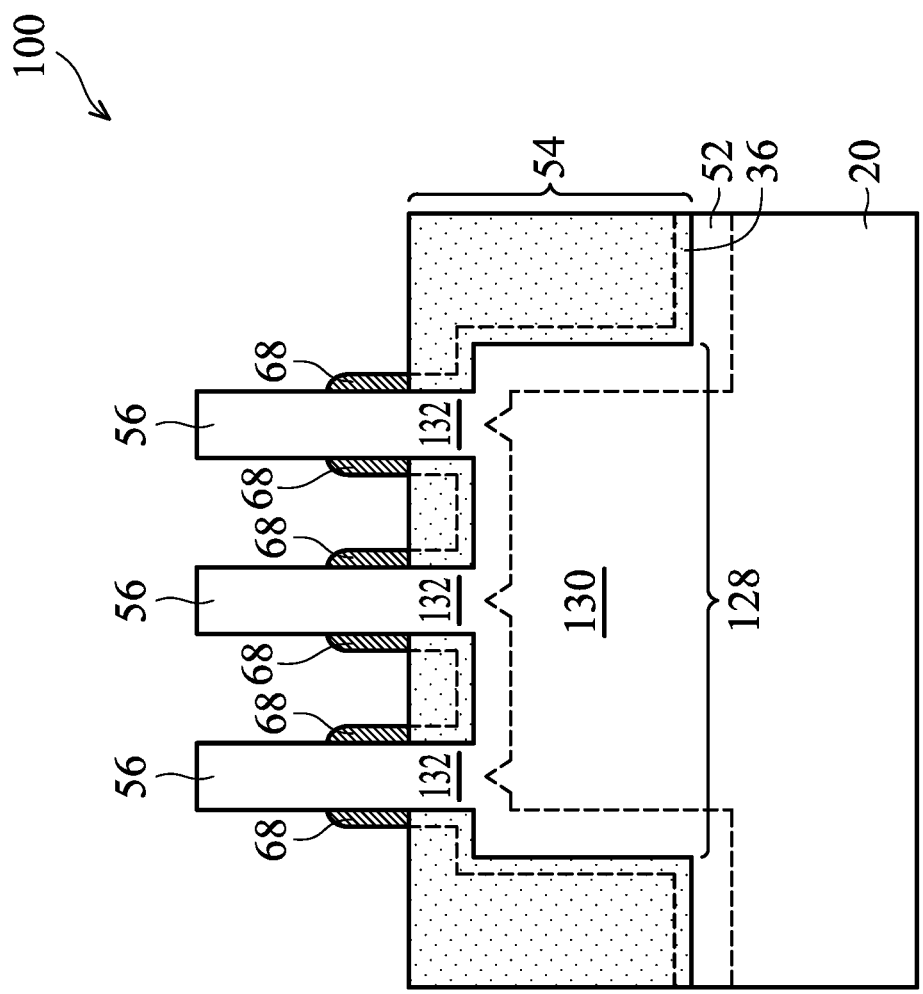

Referring to FIG. 12A, an anisotropic etching is performed to remove the horizontal portions of spacer layer 64. The remaining vertical portions of spacer layer 64 form gate spacers 66 on the sidewalls of dummy gate stack 58, and fin spacers 68 on the sidewalls of semiconductor fins 56. The respective step is illustrated as step 220 in the process flow shown in FIG. 18. FIG. 12B illustrate a cross-sectional view of a portion of the structure shown in FIG. 12A, wherein the cross-sectional view is obtained from the vertical plane crossing line 12B-12B in FIG. 12A. The cross-sectional view shown in subsequent FIGS. 13 through 16 are also obtained from the same vertical plane (which passes through an uncovered portion of semiconductor fin(s) 56) crossing line 12B-12B as shown in FIG. 12A.

Figure 13:
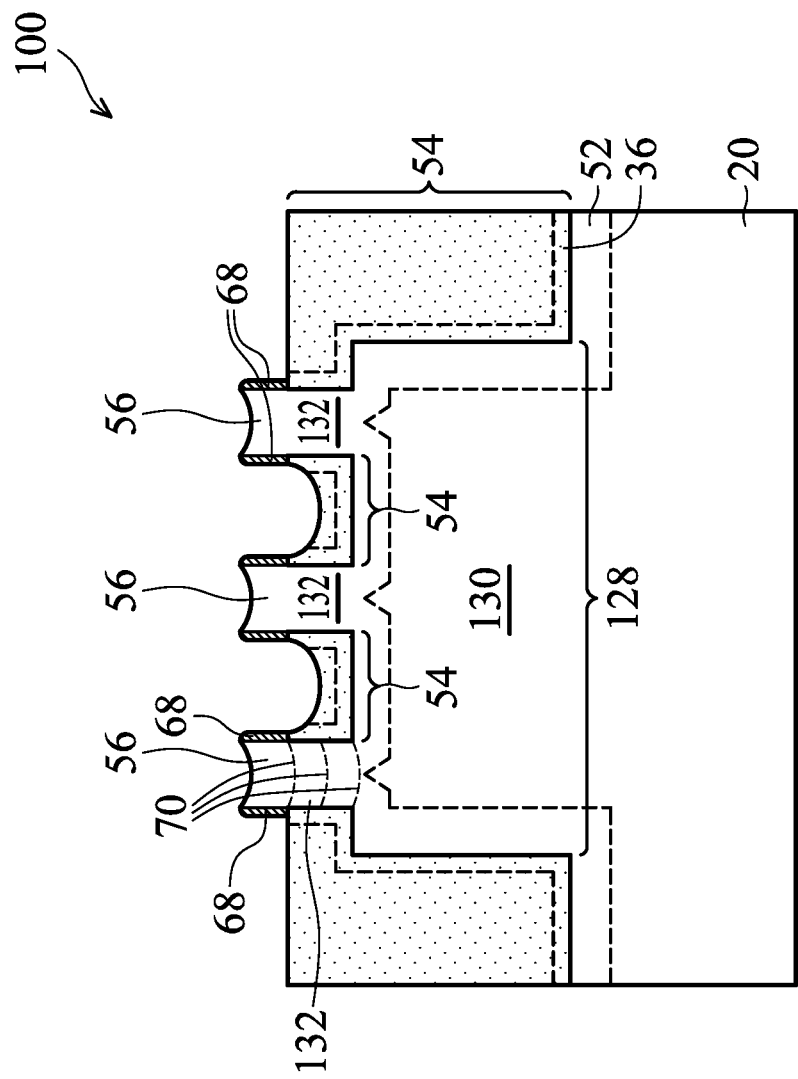

Next, as shown in FIG. 13, the exposed portions of semiconductor fins 56 are recessed in an etching process. The respective step is illustrated as step 222 in the process flow shown in FIG. 18. In the same process, fin spacers 68 are also etched back, and the heights of the fin spacers 68 are reduced. The process conditions (such as the etching selectivity between the etching rate of semiconductor fins 56 and the etching rate of fin spacers 68) may be adjusted so that fin spacers 68 are lowered, and some remaining fin spacers 68 are left. After the recessing of semiconductor fins 56 is ended, there are also some residue portions of semiconductor fins 56 (or semiconductor strips 132) left, and some STI portions 54 remain directly over semiconductor base 130. After the etching, the portions of semiconductor fins 56 directly underling dummy gate stack 62 (FIG. 12A) remain. By adjusting the etching conditions such as the etchant, the temperature, the etching duration, and the material of fin spacers 56, the top surfaces of remaining fins 56 may be at various locations as represented by dashed lines 70.

Figure 14A:
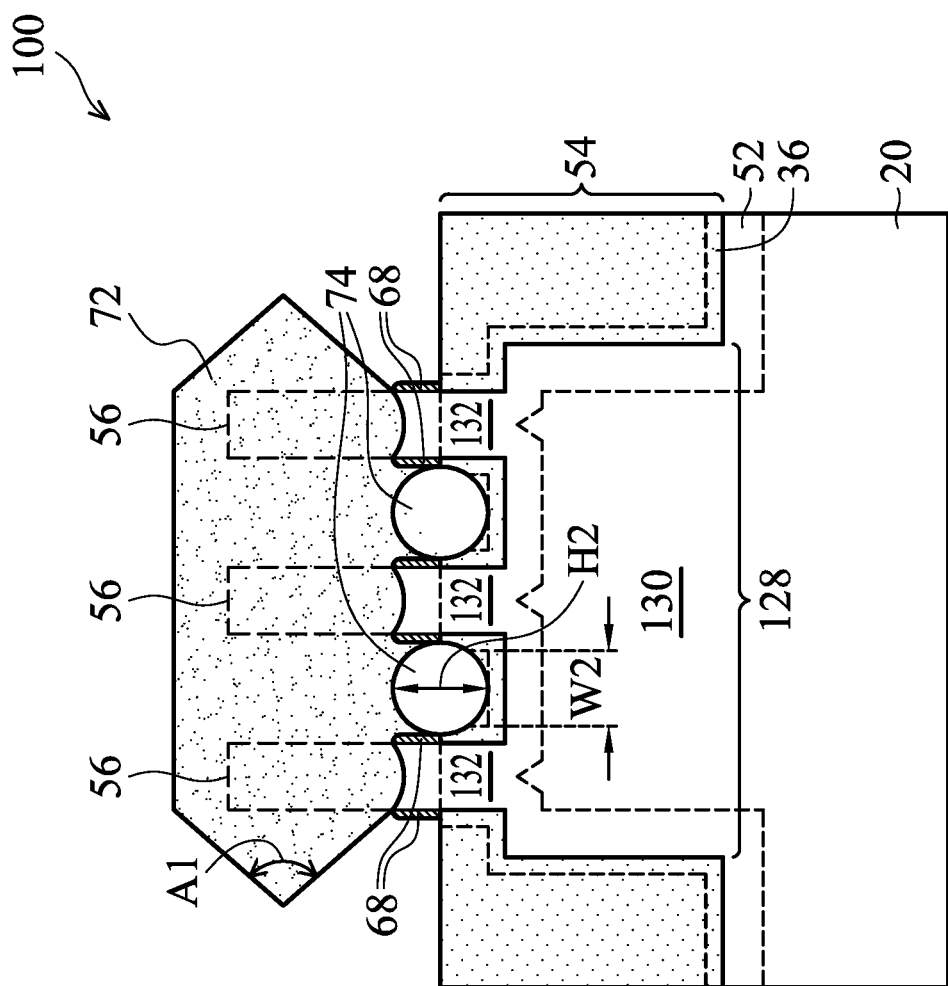
Figure 14B:
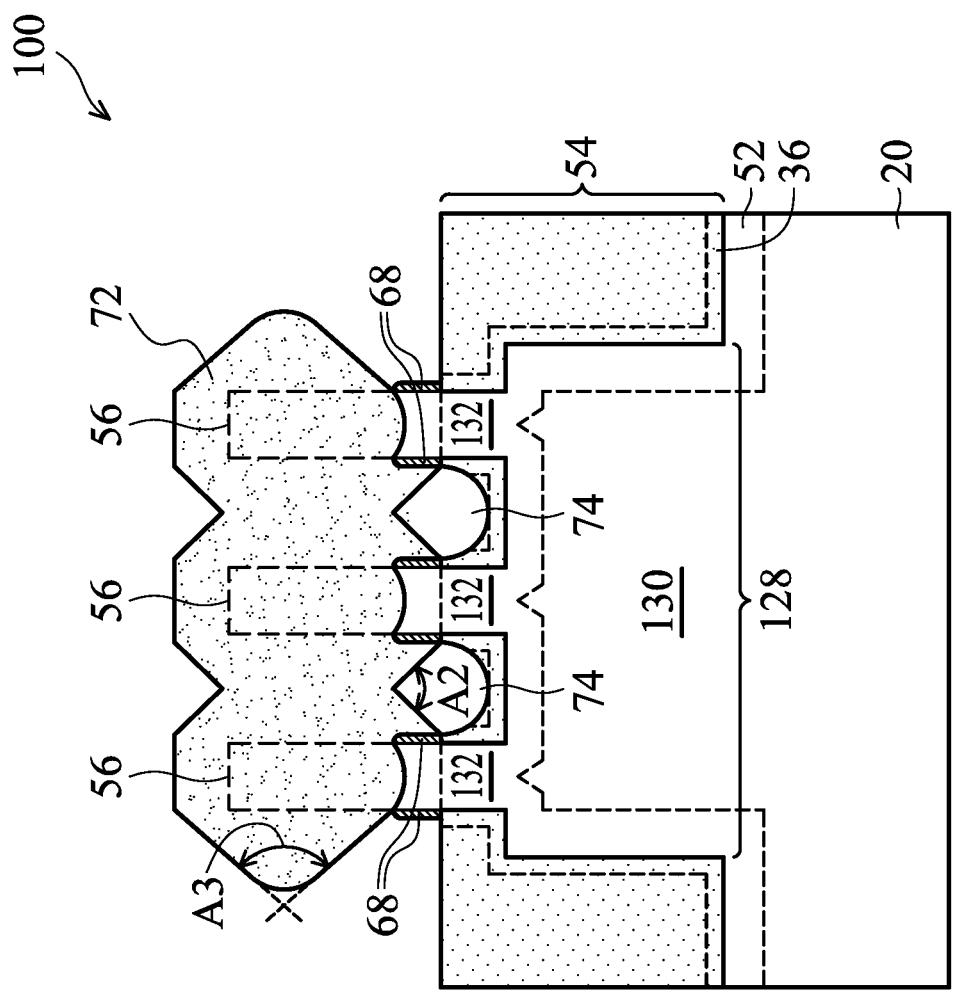
FIG. 14B illustrates a cross-sectional view of a source/drain region of a FinFET in accordance with some embodiments.

Referring to FIGS. 14A and 14B, an epitaxy is performed to re-grow epitaxy region 72, which is grown from remaining fins 56 or strip 132, but not from fin spacers 68 and STI regions 54. The respective step is illustrated as step 224 in the process flow shown in FIG. 18. Epitaxy region 72 forms the source/drain region of the resulting FinFET. Epitaxy region 72 may include silicon germanium doped with boron when the respective FinFET is a p-type FinFET, or may include silicon phosphorous or silicon carbon phosphorous when the respective FinFET is an n-type FinFET.

FIG. 14A illustrates the profile of epitaxy region 72 when epitaxy region 72 is of p-type, and the resulting FinFET is a p-type FinFET. The corresponding epitaxy region 72 is thus a p-type region, and diffused region 52 and fins 56 are n-type regions. The doping of regions 52/56 advantageously results in the increase in their dopant concentrations, and the reduction of their resistance values. This advantageously impacts the profile of epitaxy region 72. For example, holes 74 are formed between fins 56, and the cross-sectional views have rounded shape and/or ellipse shape in the cross-sectional view. Angle A1 may be in the range between about 60 degrees and about 100 degrees. The height H2 of holes 74 may be greater than the respective width W2.

FIG. 14B illustrates the profile of epitaxy region 72 when epitaxy region 72 is of n-type, and the resulting FinFET is an n-type FinFET. The corresponding epitaxy region 72 is thus an n-type region, and diffused region 52 and fins 56 are p-type regions. The doping of regions 52/56 advantageously results in the increase in their dopant concentrations, and the reduction of their resistance values. This advantageously impacts the profile of epitaxy region 72. For example, holes 74 are formed between fins 56, and the cross-sectional views of holes 74 include a rounded bottom portion and a triangular top portion. The triangular top portion has substantially straight edges as illustrated. Angle A2 may be in the range between about 60 degrees and about 100 degrees. Angle A3 may be in the range between about 130 degrees and about 160 degrees. In FIGS. 14A and 14B, semiconductor fins 56, which still remain directly under dummy gate stack 58 (FIG. 12A), are illustrated using dashed lines since they are not in the illustrate plane.

The structures shown in FIGS. 14A and 14B may be formed on the same semiconductor substrate 20 and in the same semiconductor chip to improve the performance of both p-type FinFETs and n-type FinFETs. It was found that when the profiles as shown in FIGS. 14A and 14B are generated for p-type FinFETs and n-type FinFETs, respectively, the FinFETs have good performance.

Figure 15:
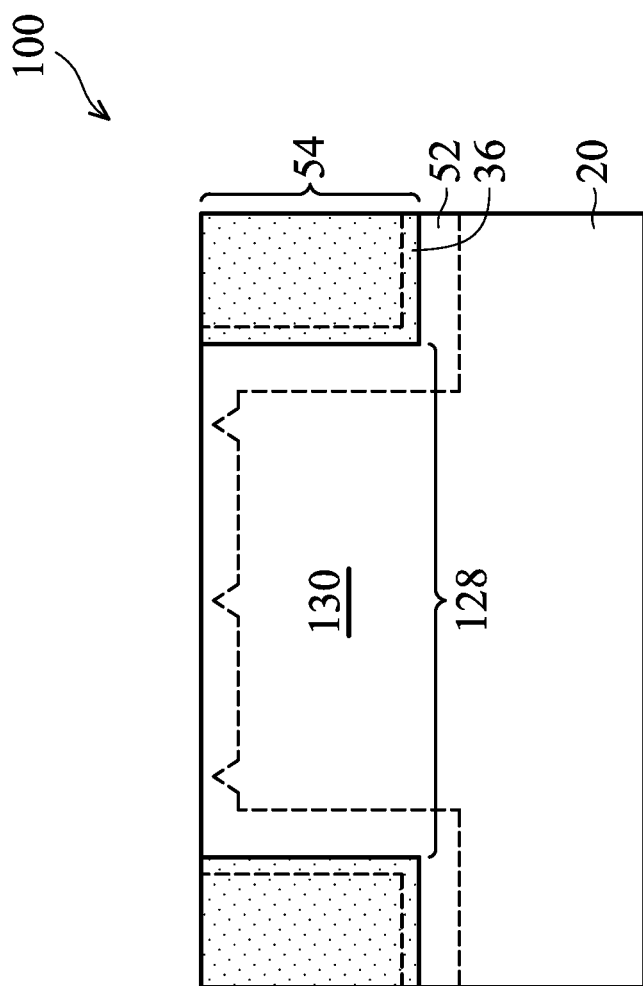
FIGS. 15 and 16 illustrate the cross-sectional views of intermediate stages in the formation of a source/drain region of a FinFET in accordance with some embodiments.

FIG. 15 illustrates a cross-sectional view of the structure after semiconductor fins 56 as shown in FIGS. 12A and 12B are recessed/etched in accordance with alternative embodiments. The initial steps in accordance with these embodiments are similar to the steps shown in FIGS. 1 through 12A and 12B, and are not repeated. The process conditions for etching semiconductor fins 56 (FIGS. 12A and 12B) are adjusted, so that fin spacers 68 (FIG. 12B), semiconductor fins 56 and the underlying semiconductor strips 132, and the portions of STI regions 54 higher than semiconductor base 130 are removed. Accordingly, all dielectric materials over base 130 and in the illustrated cross-sectional view are removed. Semiconductor base 130 may be un-etched or may be slightly etched. Diffused region 52 in the top portion of base 130 still remains.

Figure 16:
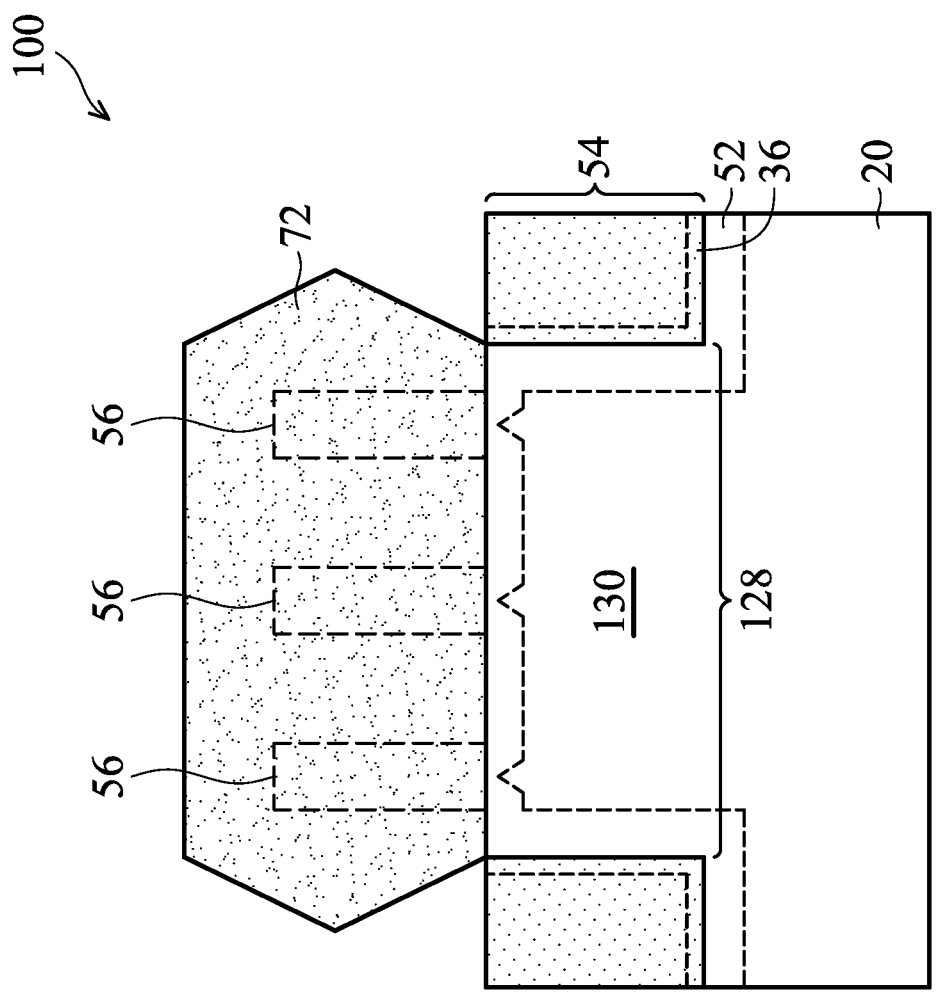

Next, as shown in FIG. 16, epitaxy region 72 is formed as a bulk region, wherein no hole is formed in epitaxy region 72. Epitaxy region 72 forms the source/drain region of the resulting FinFET. In FIG. 16, semiconductor fins 56, which still remain directly under dummy gate stack 58 (FIG. 12A), are illustrated using dashed lines since they are not in the illustrate plane.

Figure 17:
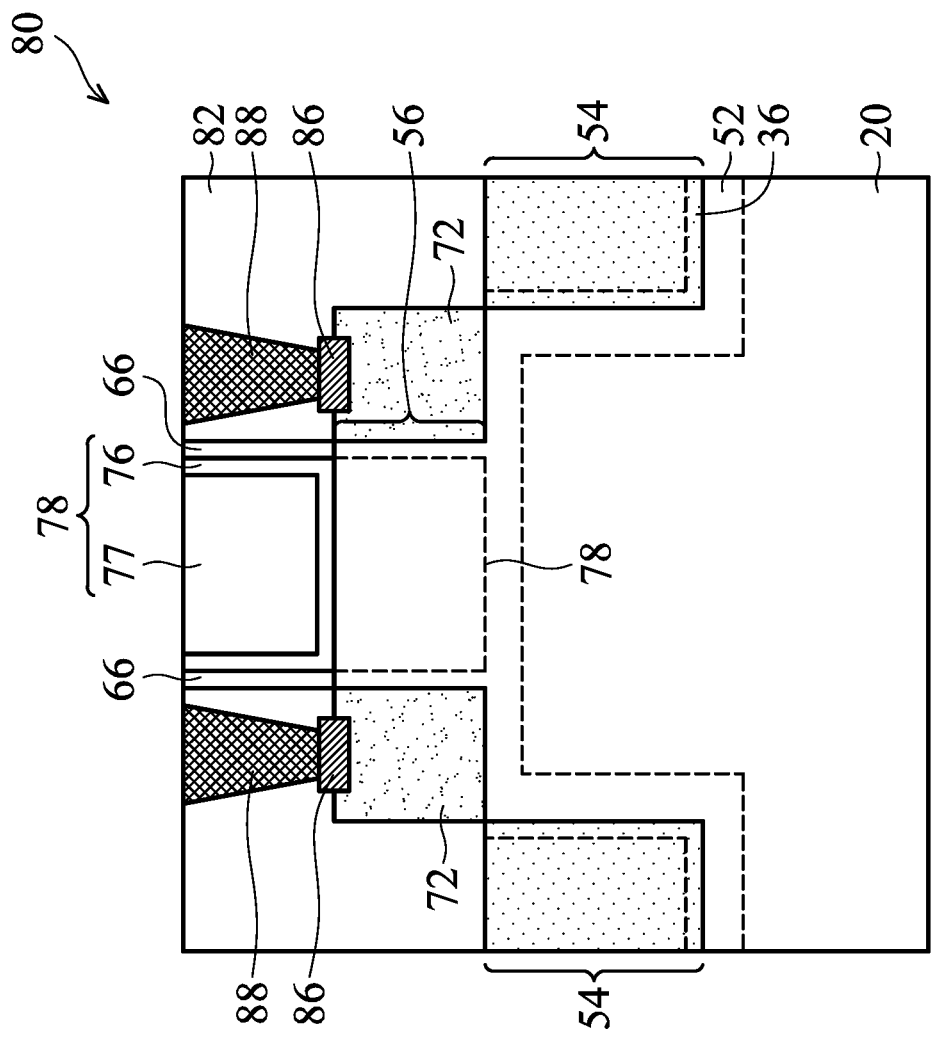
FIG. 17 illustrates a cross-sectional view of a FinFET in accordance with some embodiments.

Subsequently, a plurality of process steps is performed to finish the formation of the FinFET. An exemplary FinFET 80 is illustrated in FIG. 17. The dummy gate stack 58 as shown in FIG. 12A is replaced with replacement gate 78. The respective step is illustrated as step 226 in the process flow shown in FIG. 18. Replacement gate 78 includes gate dielectric 76 on the top surfaces and sidewalls of the respective fin 56, and gate electrode 77 over gate dielectric 76. Gate dielectric 76 may be formed through thermal oxidation, and hence may include thermal silicon oxide. The formation of gate dielectric 76 may also include one or a plurality of deposition steps, and the resulting gate dielectric 76 may include a high-k dielectric material or a non-high-k dielectric material. Gate electrode 77 is then formed on gate dielectric 76, and may be formed of metal layers. The formation processes of these components are not discussed in detail. Source/drain silicide regions 86 are formed on the surfaces of source/drain regions 72. Source/drain contact plugs 88 are formed in Inter-Layer Dielectric (ILD) 82, and are electrically connected to the respective source/drain silicide regions 86. Diffused region 52 forms a portion of the well region for FinFET 80.

The embodiments of the present disclosure have some advantageous features. By doping semiconductor strips in early stages and by adjusting the recessing of semiconductor fins during the formation of source/drain regions, desirable profiles may be formed for epitaxy source/drain regions, which lead to improved performance. Also, by etching a plurality of semiconductor fins and growing a bulk source/drain region, the source/drain resistance is reduced, and the performance of the FinFETs is improved.

In accordance with some embodiments of the present disclosure, a method includes etching a semiconductor substrate to form a first trench and a second trench. A remaining portion of the semiconductor substrate is left between the first trench and the second trench as a semiconductor region. A doped dielectric layer is formed on sidewalls of the semiconductor region and over a top surface of the semiconductor region. The doped dielectric layer includes a dopant. The first trench and the second trench are filled with a dielectric material. An anneal is then performed, and a p-type dopant or an n-type dopant in the doped dielectric layer is diffused into the semiconductor region to form a diffused semiconductor region.

In accordance with some embodiments of the present disclosure, a method includes etching a semiconductor substrate to form a semiconductor region, which includes a semiconductor base and a plurality of semiconductor strips over and connecting to the semiconductor base. A first trench and a second trench extend into the semiconductor substrate and are on opposite sides of the semiconductor region. The first trench and the second trench are filled with a dielectric material to form isolation regions. The method further includes recessing the isolation regions so that top portions of the plurality of semiconductor strips form a plurality of semiconductor fins, forming a gate stack on first portions of the plurality of semiconductor fins, etching second portions of the plurality of semiconductor fins not covered by the gate stack, and performing an epitaxy from a remaining portion of the semiconductor region to form an epitaxy source/drain region.

In accordance with some embodiments of the present disclosure, a method includes etching a semiconductor substrate to form a first semiconductor region and a second semiconductor region separated from each other by trenches, and forming a first doped dielectric layer doped with a first dopant having a first conductivity type. The first doped dielectric layer is formed on sidewalls and top surfaces of the first semiconductor region and the second semiconductor region. The method further includes removing portions of the first doped dielectric layer on the first semiconductor region and forming a second doped dielectric layer doped with a second dopant having a second conductivity type opposite to the first conductivity type. The second doped dielectric layer is formed on sidewalls and top surfaces of the first semiconductor region, and covers remaining portions of the first doped dielectric layer on the second semiconductor region. The method further includes filling a dielectric material into the trenches and over the first doped dielectric layer and the second doped dielectric layer, and performing an anneal. The anneal causes the second dopant to be diffused into a first surface layer of the first semiconductor region, and the first dopant to be diffused into a second surface layer of the second semiconductor region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit device, the method comprising:
   etching a semiconductor substrate to form a first trench and a second trench, wherein a remaining portion of the semiconductor substrate is left between the first trench and the second trench as a semiconductor region;
   forming a first doped dielectric layer, wherein the first doped dielectric layer comprises sidewall portions on sidewalls of the semiconductor region and a top surface portion overlapping a top surface of the semiconductor region, wherein the first doped dielectric layer comprises Boro-Silicate-Glass (BSG);
   forming a second doped dielectric layer extending on the sidewalls of the semiconductor region and over the top surface of the semiconductor region, wherein the second doped dielectric layer comprises Phospho-Silicate-Glass (PSG), and wherein the first doped dielectric layer directly contacts the second doped dielectric layer;
   filling the first trench and the second trench with a dielectric material, wherein the dielectric material is overlying both of the first doped dielectric layer and the second doped dielectric layer; and performing an anneal process to diffuse both of phosphorous and boron in the first doped dielectric layer and the second doped dielectric layer into the semiconductor region to form a diffused semiconductor region.

2. The method of claim 1 further comprising recessing the dielectric material, the first doped dielectric layer, and the second doped dielectric layer, wherein the anneal process is performed before the recessing.

3. The method of claim 1, wherein the first doped dielectric layer is deposited over the second doped dielectric layer, and wherein the diffused semiconductor region is of n-type.

4. The method of claim 1, wherein the second doped dielectric layer is deposited over the first doped dielectric layer, and wherein the diffused semiconductor region is of p-type.

5. The method of claim 1 further comprising:
after the etching the semiconductor substrate and before forming the first doped dielectric layer and the second doped dielectric layer, performing steps of:
oxidizing a surface layer of the semiconductor substrate to form an oxide layer; and
removing the oxide layer.

6. The method of claim 1, wherein one of the first doped dielectric layer and the second doped dielectric layer is in contact with the semiconductor region.

7. The method of claim 1, wherein the semiconductor region is over a bulk portion of the semiconductor substrate, and one of the first doped dielectric layer and the second doped dielectric layer has a bottom portion, and a bottom surface of the bottom portion contacts a top surface of the bulk portion.

8. The method of claim 1 further comprising growing an epitaxy region from the diffused semiconductor region.

9. A method of forming an integrated circuit device, the method comprising:
forming a first semiconductor region and a second semiconductor region over a bulk semiconductor substrate;
depositing a Phospho-Silicate-Glass (PSG) layer, wherein the PSG layer comprises:
a first portion on the first semiconductor region;
a second portion on the second semiconductor region; and
a bottom portion over and contacting the bulk semiconductor substrate, wherein the bottom portion connects the first portion to the second portion;
removing the second portion of the PSG layer on the second semiconductor region, wherein the first portion of the PSG layer is left on the first semiconductor region;
after the removing the second portion, depositing a Boro-Silicate-Glass (BSG) layer, wherein the BSG layer comprises a third portion directly over and physically contacting the first portion of the PSG layer, and a fourth portion on the second semiconductor region;
forming a dielectric material over the BSG layer;
performing an anneal process to drive boron and phosphorous into the first semiconductor region; and
recessing the dielectric material, the PSG layer, and the BSG layer, wherein the anneal process is performed before the recessing.

10. The method of claim 9, wherein the recessing results in a top portion of the first semiconductor region to form a semiconductor fin, and the method further comprises forming a source/drain region from the semiconductor fin.

11. The method of claim 9 further comprising forming a p-type transistor based on the first semiconductor region.

12. The method of claim 9, wherein the first semiconductor region comprises a semiconductor base, and semiconductor strips over and connecting to the semiconductor base, and the method further comprises:
etching the semiconductor strips; and
performing an epitaxy from a remaining portion of the semiconductor strips to form an epitaxy semiconductor region.

13. The method of claim 12 further comprising:
forming spacers on sidewalls of semiconductor strips; and
recessing top portions of the semiconductor strips, wherein portions of the epitaxy semiconductor region grown from remaining portions of the semiconductor strips merge with each other.

14. A method of forming an integrated circuit device, the method comprising:
etching a semiconductor substrate to form a trench extending into the semiconductor substrate;
oxidizing a semiconductor region on a side of the trench to form an oxide layer, wherein the oxide layer comprises a part in the trench, and the part comprises:
a first vertical portion;
a second vertical portion; and
a horizontal portion connecting the first vertical portion to the second vertical portion;
removing entireties of the first vertical portion, the second vertical portion, and the horizontal portion of the oxide layer to reveal the semiconductor region;
after the oxide layer is removed, depositing a Boro-Silicate-Glass (BSG) layer and a Phospho-Silicate-Glass (PSG) layer, wherein the BSG layer and the PSG layer are stacked, and are in physical contact with each other, and wherein each of the BSG layer and the PSG layer comprises a first portion on the semiconductor region; and
annealing the BSG layer to diffuse boron into the semiconductor region.

15. The method of claim 14, wherein the semiconductor region with diffused boron and phosphorous forms a p-type well region, and the method further comprises forming an n-type Fin Field-Effect Transistor (FinFET) based on the p-type well region.

16. The method of claim 14, wherein the BSG layer is deposited over the PSG layer, and wherein the semiconductor region with diffused boron and phosphorous being an n-type well region.

17. The method of claim 14 further comprising removing a second portion of the BSG layer, with the second portion being spaced apart from the semiconductor region.

18. The method of claim 14 further comprising:
depositing a dielectric material over the BSG layer; and
recessing the dielectric material, the PSG layer, and the BSG layer, wherein the annealing is performed before the recessing.

19. The method of claim 9, wherein after the anneal process, a surface portion of the first semiconductor region contacting the first portion of the PSG layer is of n-type.

20. The method of claim 10, wherein when the source/drain region is formed, the first portion of both of the PSG layer and the BSG layer are on an additional bottom portion of the first semiconductor region.

* * * * *